(12) United States Patent
Kim et al.

(10) Patent No.: US 7,893,436 B2
(45) Date of Patent: Feb. 22, 2011

(54) ARRAY SUBSTRATE, DISPLAY APPARATUS HAVING THE SAME

(75) Inventors: Yeon-Ju Kim, Suwon-si (KR); Chong-Chul Chai, Seoul (KR); Sung-Hoon Yang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 123 days.

(21) Appl. No.: 11/932,798

(22) Filed: Oct. 31, 2007

(65) Prior Publication Data

US 2008/0203391 A1      Aug. 28, 2008

(30) Foreign Application Priority Data

Feb. 28, 2007      (KR) ...................... 10-2007-0020555

(51) Int. Cl.
*H01L 29/04* (2006.01)

(52) U.S. Cl. ............................... 257/59; 257/79; 257/88

(58) Field of Classification Search .................. 257/59, 257/79, 88
See application file for complete search history.

(56) References Cited

U.S. PATENT DOCUMENTS

2007/0002243 A1* 1/2007 Kim ........................... 349/139

* cited by examiner

*Primary Examiner*—Long Pham
(74) *Attorney, Agent, or Firm*—Cantor Colburn LLP

(57) ABSTRACT

An array substrate includes a base substrate which includes a display area and a peripheral area adjacent to the display area, a plurality of fan-out lines arranged in the peripheral area to receive a driving signal from an exterior source, at least one fan-out line among the plurality of fan-out lines arranged on a different layer from a layer on which remaining fan-out lines of the plurality of fan-out lines are arranged, a plurality of signal lines arranged in the display area to receive the driving signal from the plurality of fan-out lines and a pixel array arranged in the display area to receive the driving signal from the plurality of signal lines.

23 Claims, 13 Drawing Sheets

ARRAY SUBSTRATE, DISPLAY APPARATUS HAVING THE SAME

This application claims priority to Korean Patent Application No. 2007-20555, filed on Feb. 28, 2007, and all the benefits accruing therefrom under 35 U.S.C. §119, the contents of which in its entirety are herein incorporated by reference.

BACKGROUND OF THE INVENTION

1. Field of the Invention

The present invention relates to an array substrate, a display apparatus having the same. More particularly, the present invention relates to an array substrate having an improved display quality, a display apparatus having the array substrate.

2. Description of the Related Art

In general, a liquid crystal display ("LCD") includes an array substrate, an opposite substrate facing the array substrate and a liquid crystal layer disposed between the array substrate and the opposite substrate.

The array substrate includes a display area in which a plurality of signal lines insulated from each other are arranged including a plurality of gate lines intersecting a plurality of data lines. The array substrate includes a peripheral area in which a gate driving chip and a data driving chip are arranged. The gate driving chip outputs a gate signal, and the data driving chip outputs a data signal.

The array substrate further includes a plurality of gate fan-out lines which are arranged between the gate driving chip and the plurality of gate lines. The plurality of gate fan-out lines provides the gate signal from the gate driving chip to the plurality of gate lines.

Further, the array substrate further includes a plurality of data fan-out lines arranged between the data driving chip and the plurality of data lines. The plurality of data fan-out lines provides the data signal from the data driving chip to the plurality of data lines.

Distances between the plurality of gate fan-out lines in an area adjacent to the gate driving chip and distances between the plurality of data fan-out lines in an area adjacent to the data driving chip are narrower than distances between the plurality of gate lines and distances between the plurality of data lines. The plurality of gate fan-out lines and the plurality of data fan-out lines are partially bent, such that a difference in a length and a resistance occurs between the fan-out lines, respectively.

Recently, a size of the display area of the liquid crystal display has increased by increasing a number of pixels and a number of driving chips thereof, however, a size of the peripheral area is gradually reduced. As a result, there exists a limitation on reducing a length and a resistance difference between the fan-out lines.

BRIEF SUMMARY OF THE INVENTION

The present invention provides an array substrate having an improved display quality.

The present invention also provides a display apparatus including the array substrate.

In an exemplary embodiment of the present invention, an array substrate includes a base substrate, a plurality of fan-out lines, a plurality of signal lines and a pixel array.

In the exemplary embodiment, the base substrate includes a display area and a peripheral area adjacent to the display area. The plurality of fan-out lines are arranged in the peripheral area to receive a driving signal from an external source, and at least one fan-out line among the plurality of fan-out lines is arranged on a different layer from a layer on which remaining fan-out lines of the plurality of fan-out lines are arranged. The plurality of signal lines are arranged in the display area to receive the driving signal from the plurality of fan-out lines. The pixel array is arranged in the display area to receive the driving signal through the plurality of signal lines.

In another exemplary embodiment of the present invention, an array substrate includes a base substrate, a plurality of fan-out lines, a plurality of signal lines and a pixel array.

In the exemplary embodiment, the base substrate includes a display area and a peripheral area adjacent to the display area. The plurality of fan-out lines are arranged in the peripheral area to receive a driving signal from an external source, and odd-numbered fan-out lines among the plurality of fan-out lines are arranged on a different layer from a layer on which even-numbered fan-out lines among the plurality of fan-out lines are arranged. The plurality of signal lines is arranged in the display area to receive the driving signal from the plurality of fan-out lines. The pixel array is arranged in the display area to receive the driving signal from the plurality of signal lines.

In an exemplary embodiment, the odd-numbered fan-out lines may appear to make contact the even-numbered fan-out lines in a plan view. More specifically, the odd-numbered fan-out line may is overlap an adjacent even-numbered fan-out line.

In an exemplary embodiment, each fan-out line of the plurality of fan-out lines may be partially bent to include a serpentine portion. The serpentine portion of each of the fan-out lines may include a first serpentine portion extending in a direction along which the plurality of fan-out lines are arranged and a second serpentine portion extending from the first serpentine portion to a longitudinal direction of the plurality of fan-out lines.

In an exemplary embodiment, two adjacent fan-out lines arranged on a same layer may be spaced apart from each other at a predetermined distance.

In an exemplary embodiment, the second serpentine portion of the odd-numbered fan-out lines may be overlapped with the second serpentine portion of the even-numbered fan out lines adjacent to the odd-numbered fan-out lines. Also, the serpentine portion of the odd-numbered fan-out lines may appear to make contact with the even-numbered fan-out lines adjacent to the odd-numbered fan-out lines in a plan view (e.g., overlapping each other).

In further exemplary embodiments of the present invention, an array substrate includes a base substrate, a plurality of data fan-out lines, a plurality of data signal lines, a plurality of gate signal lines and a pixel array.

In the exemplary embodiment, the base substrate includes a display area and a peripheral area adjacent to the display area. The plurality of data fan-out lines are arranged in the peripheral area to receive a data signal from an external source, and odd-numbered data fan-out lines among the plurality of data fan-out lines are arranged on a different layer from a layer on which even-numbered data fan-out lines among the plurality of data fan-out lines are arranged. The plurality of data signal lines are arranged in the display area to receive the data signal from the plurality of data fan-out lines. The plurality of gate signal lines is arranged in the display area to receive a gate signal. The pixel array is arranged in the display area, and the pixel array receives the data signal through the plurality of data signal lines and the gate signal through the plurality of gate signal lines to display an image.

In exemplary embodiments, the array substrate may further include a plurality of gate fan-out lines arranged in the peripheral area to output the gate signal to the plurality of gate signal lines. The odd-numbered gate fan-out lines may be arranged on a different layer from a layer on which the even-numbered gate fan-out lines are arranged to insulate the odd-numbered gate fan-out lines from the even-numbered gate fan-out lines.

In still another exemplary embodiment of the present invention, a method of fabricating an array substrate is provided.

In the exemplary embodiment, a plurality of fan-out lines which outputs a driving signal is formed in a peripheral area of a base substrate such that odd-numbered fan-out lines among the plurality of fan-out lines are arranged on a different layer from a layer on which even-numbered fan-out lines among the plurality of fan-out lines.

Then, a plurality of signal lines and a pixel array are formed in a display area adjacent to the peripheral area of the base substrate. The plurality of signal lines receives the driving signal from the plurality of fan-out lines and transmits the driving signal. The pixel array receives the driving signal from the plurality of signal lines to display an image.

In still further exemplary embodiments of the present invention, a display apparatus includes an array substrate, an opposite substrate facing the array substrate and a driving chip mounted on the array substrate to output a driving signal.

In the exemplary embodiment, the array substrate includes a base substrate, a plurality of fan-out lines, a plurality of signal lines and a pixel array. The base substrate includes a display area and a peripheral area adjacent to the display area. The plurality of fan-out lines are arranged in the peripheral area to receive the driving signal from the driving chip, and odd-numbered fan-out lines among the plurality of fan-out lines are arranged on a different layer from a layer on which even-numbered fan-out lines among the plurality of fan-out lines are arranged. The plurality of signal lines is arranged in the display area to receive the driving signal from the plurality of fan-out lines. The pixel array is arranged in the display area to receive the driving signal through the plurality of signal lines.

According to the above, since the odd-numbered fan-out lines are arranged on the different layer from the even-numbered fan-out lines, a distance between the odd-numbered fan-out line and the even-numbered fan-out line may be reduced. Thus, the array substrate may reduce a difference in length and resistance between the fan-out lines. As a result, the display apparatus may prevent a delay of signal transmission and include an improved display quality.

BRIEF DESCRIPTION OF THE DRAWINGS

The above and/or other aspects, features and advantages of the present invention will now become readily apparent by reference to the following detailed description when considered in conjunction with the accompanying drawings, in which.

DETAILED DESCRIPTION OF THE INVENTION

Figure 1:
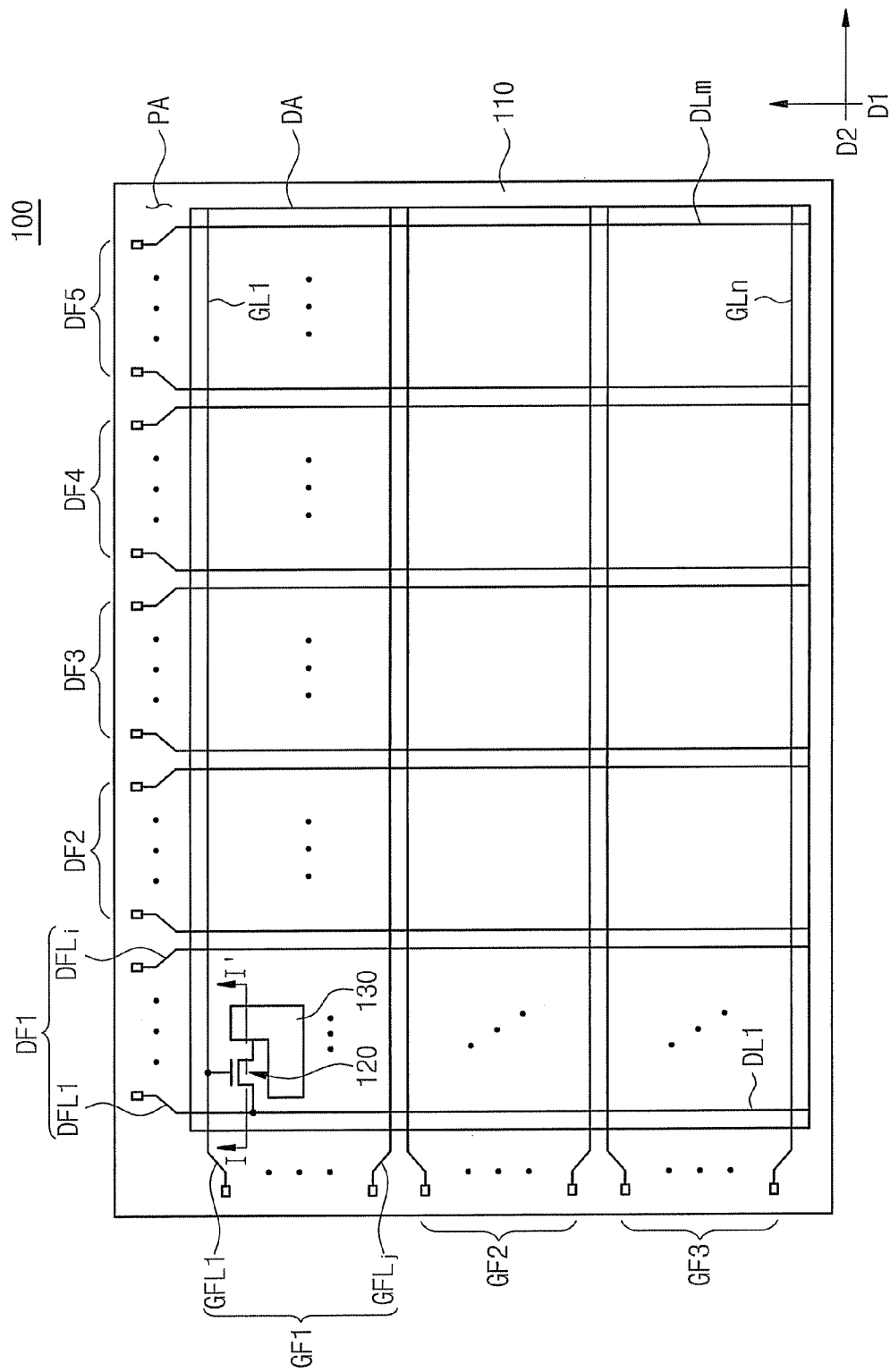
FIG. 1 is a top plan view illustrating an exemplary embodiment of an array substrate according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be explained in further detail with reference to the accompanying drawings.

Figure 2:
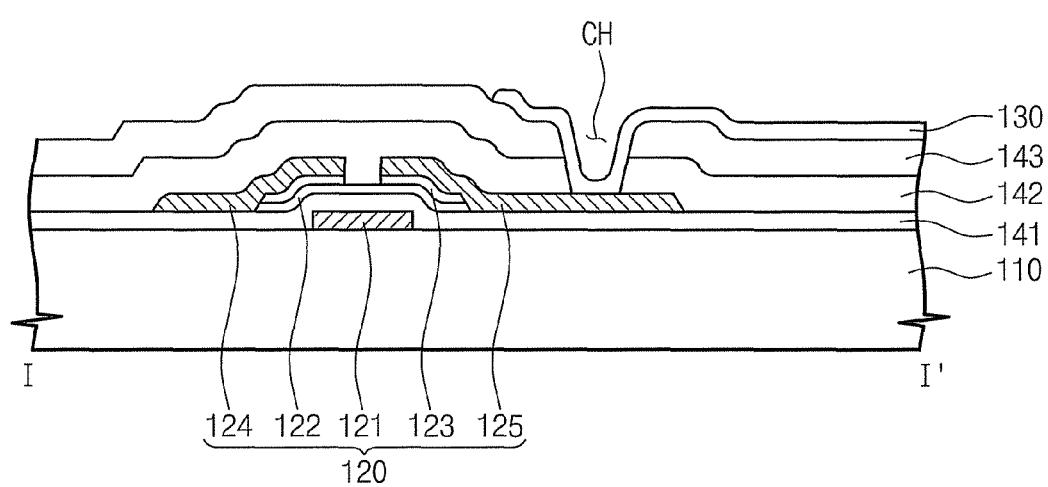
FIG. 2 is a cross-sectional schematic diagram view taken along line I-I' of FIG. 1.

FIG. 1 is a top plan view illustrating an exemplary embodiment of an array substrate according to the present invention, and FIG. 2 is a cross-sectional schematic diagram view taken along line I-I' of FIG. 1.

Referring to FIG. 1, an array substrate 100 includes a base substrate 110, a plurality of data lines DL1~DLm, a plurality of gate lines GL1~GLn, a plurality of thin film transistors ("TFTs") 120, a plurality of pixel electrodes 130 and a plurality of fan-out portions DF1~DF5. In the current exemplary embodiment, each 'm' and 'n' is a natural number equal to or greater than 1.

The base substrate 110 includes a display area DA on which an image is displayed and a peripheral area PA which substantially surrounds the display area DA. The display area DA is divided into a plurality of pixel areas.

The data lines DL1~DLm and the gate lines GL1~GLn are arranged in the display area DA. The data lines DL1~DLm, which transmit a data signal, extend substantially in a first direction D1 and are arranged along a second direction D2. In exemplary embodiments, the second direction is substantially perpendicular to the first direction D1. The gate lines GL1~GLn, which transmit a gate signal, extend substantially in the second direction D2. In exemplary embodiments, the gate lines GL1~GLn are insulated from and intersected by the data lines DL1~DLm, to thereby define the pixel areas.

Referring to FIGS. 1 and 2, the TFTs 120 and the pixel electrodes 130 are arranged in the display area DA in a matrix configuration. Each of the TFTs 120 includes a gate electrode 121 which is arranged on the base substrate 110, an active layer 122 and an ohmic contact layer 123 which are sequentially arranged above the gate electrode 121 and source and drain electrodes 124 and 125 which are arranged on the ohmic contact layer 123. In a first pixel area among the pixel areas, a first TFT 120 includes a gate electrode 121 which is connected to a first gate line GL1 among the gate lines GL1~GLn, a source electrode 124 which is connected to a first data line DL1 among the data lines DL1~DLm and a drain electrode 125 which is connected to a pixel electrode 130. In exemplary embodiments, the pixel electrodes 130 include a transparent conductive material such as indium tin oxide ("ITO") or indium zinc oxide ("IZO") and receive a pixel voltage through the TFTs 120.

The array substrate 100 further includes a gate insulation layer 141, a protective layer 142 and an organic insulation layer 143. The gate insulation layer 141 is arranged on the base substrate 110 to cover the gate lines GL1~GLn and the gate electrode 121 of the TFT 120. The data lines DL1~DLm and the source and drain electrodes 124 and 125 are arranged on the gate insulation layer 141. The protective layer 142 is arranged on the gate insulation layer 141 to cover the data lines DL1~DLm and the source and drain electrodes 124 and 125. The organic insulation layer 143 is arranged on the protective layer 142, and the pixel electrodes 130 are arranged on the organic insulation layer 143. A portion of the protective layer 142 and a portion of the organic insulation layer 143 are removed to form a contact hole CH therethrough, such that the drain electrode 125 of the first TFT 120 is electrically connected to the pixel electrode 130 through the contact hole CH.

The data fan-out portions DF1~DF5 are arranged in the peripheral area PA of the base substrate 110, and the data fan-out portions DF1~DF5 include first, second, third, fourth and fifth data fan-out portions DF1, DF2, DF3, DF4 and DF5, respectively. In the current exemplary embodiment, five data fan-out portions DF1~DF5 are applied to the array substrate 100. However, in exemplary embodiments, a number of the data fan-out portions may be increased or decreased in accordance with a number of data lines DL1~DLm and a number of data driving chips (not shown), which output the data signal.

The first to fifth data fan-out portions DF1~DF5 are arranged adjacent to a source-side of the array substrate 100 and receive the data signal in order to provide the data lines DL1~DLm with the data signal. Hereinafter, the first data fan-out portion DF1 will be described in detail as a representative example, since the first to fifth data fan-out portions DF1~DF5 include a same structure and function.

Figure 3:
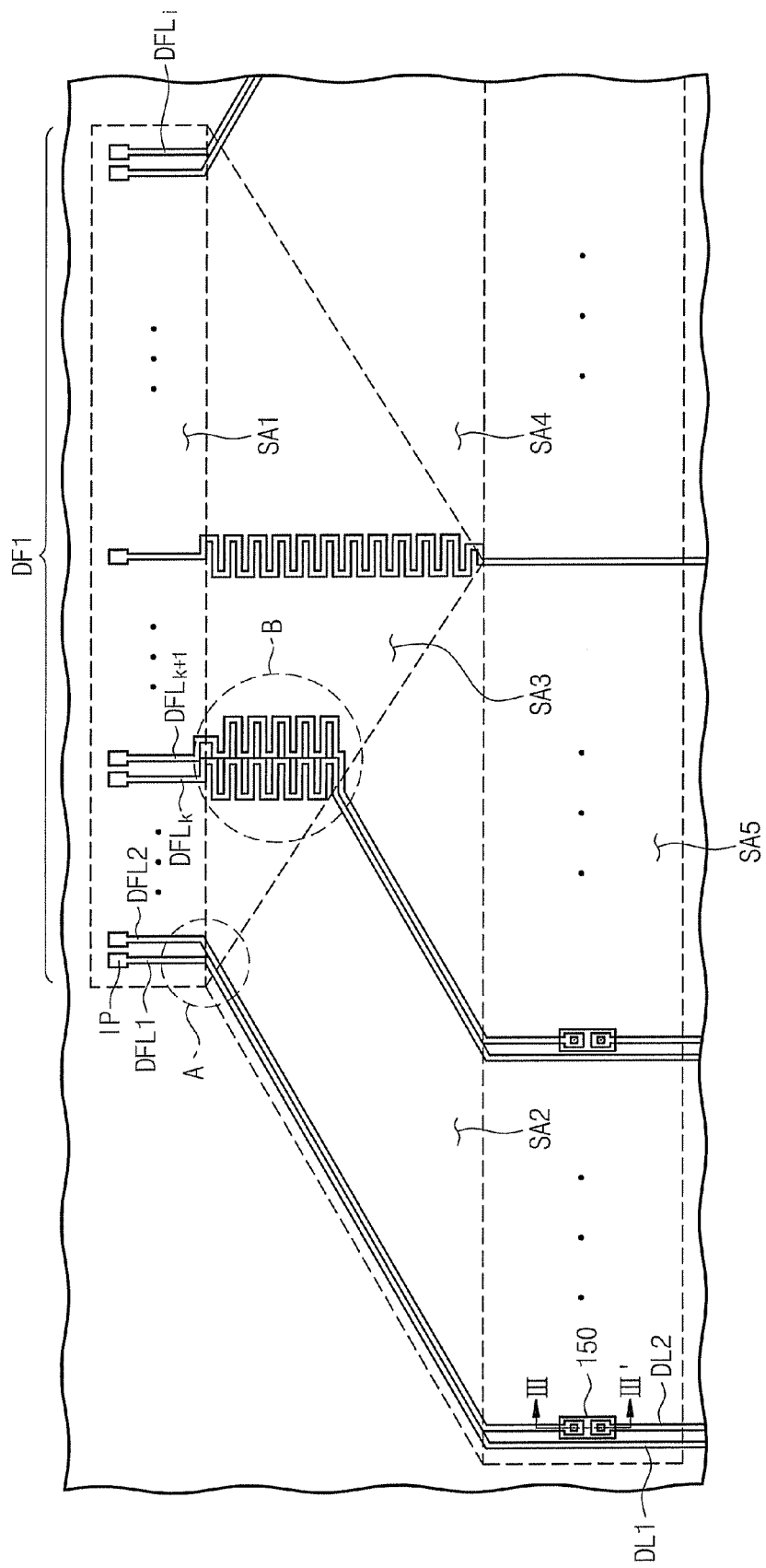
FIG. 3 is an enlarged top plan view illustrating an exemplary embodiment of a first data fan-out portion of FIG. 1.

FIG. 3 is an enlarged top plan view illustrating an exemplary embodiment of a first data fan-out portion of FIG. 1.

Referring to FIGS. 1 and 3, the first data fan-out portion DF1 includes first to i-th data fan-out lines DFL1~DLFi (where 'i' is greater than 1). The first to i-th data fan-out lines DFL1~DFLi extend substantially in the first direction D1 and are sequentially arranged along the second direction D2. Each of the first to i-th data fan-out lines DFL1~DFLi is electrically connected to a corresponding data line among the data lines DL1~DLm in order to provide the data signal to the corresponding data line. For instance, the first data fan-out line DFL1 of the first data fan-out portion DF1 is connected to the first data line DL1, and the second data fan-out line DFL2 is connected to the second data line DL2.

The first to i-th data fan-out lines DFL1~DFLi are arranged in a data fan-out area of the base substrate 110, and the data fan-out area is divided into first to fifth sub areas SA1~SA5. The data driving chip is arranged in the first sub area SA1, and the second, third and fourth sub areas SA2, SA3 and SA4, respectively, are positioned below the first sub area SA1. The second and fourth sub areas SA2 and SA4 include a triangular shape and are adjacent to each other. The third sub area SA3 is defined by the first, second and fourth sub areas SA1, SA2 and SA4 and includes a triangular shape. The fifth sub area SA5 is positioned below the second to fourth sub areas SA2, SA3 and SA4 and the fifth sub area SA5 is adjacent to the display area DA. However, the first to fifth sub areas SA1~SA5 of present invention are not limited to a triangular shape.

Each of the first to i-th data fan-out lines DFL1~DFLi includes an input pad IP, and the input pad IP is arranged in the first sub area SA1 in order to receive the data signal. In the first sub area SA1, the first to i-th data fan-out lines DFL1~DFLi are spaced apart from each other and include a substantially linear shape. However, the present invention is not limited thereto.

The first to i-th data fan-out lines DFL1~DFLi extend toward the third sub area SA3 from the first sub area SA1, and the first to i-th data fan-out lines DFL1~DFLi extend toward to the second sub area SA2 or toward the fourth sub area SA4 after being bent in the third sub area SA3.

Figure 4:
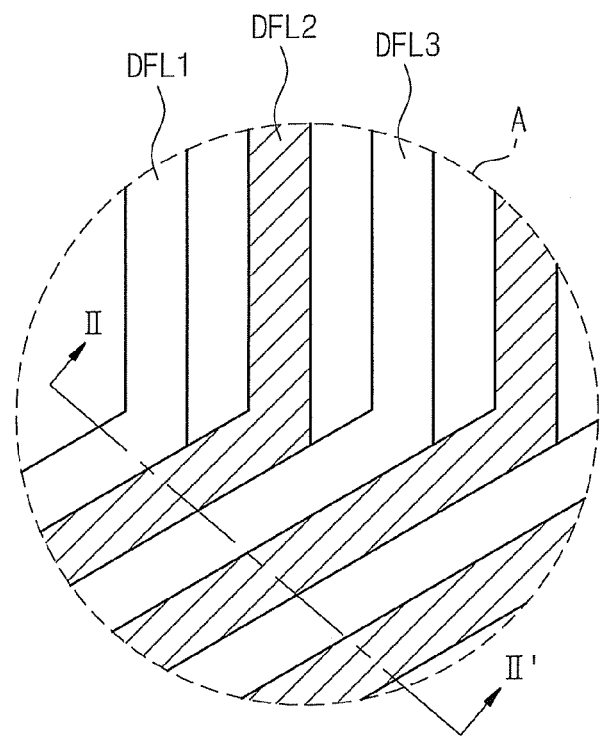
FIG. 4 is an enlarged top plan view illustrating portion 'A' of FIG. 3.
Figure 5:
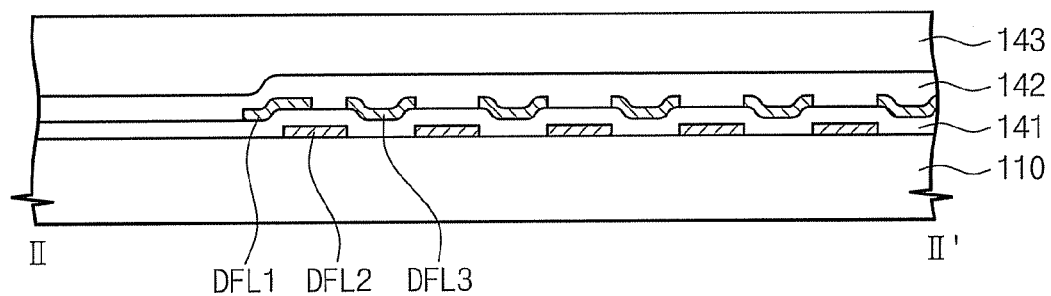
FIG. 5 is a cross-sectional schematic diagram view taken along line II-II' of FIG. 4.

FIG. 4 is an enlarged top plan view illustrating portion 'A' of FIG. 3, and FIG. 5 is a cross-sectional schematic diagram view taken along line II-II' of FIG. 4.

Referring to FIGS. 3 and 4, in the second and fourth sub areas SA2 and SA4, odd-numbered data fan-out lines appear to make contact with even-numbered data fan-out lines which are adjacent to each other in a top plan view. In an exemplary embodiment, the second data fan-out line DFL2 appears to make contact with the first and third data fan-out lines DFL1 and DFL3 in a top plan view. Two even-numbered data fan-out lines, which are adjacent to each other, appear to may make contact with one odd-numbered data fan-out line. One even-numbered data fan-out line may appear to make contact with two odd-numbered data fan-out lines.

Referring now to FIGS. 3 and 5, the odd-numbered data fan-out lines are arranged on a different layer from a layer on which the even-numbered data fan-out lines are arranged, such that the odd-numbered data fan-out lines are electrically insulated from the even-numbered data fan-out lines. In the current exemplary embodiment, the even-numbered data fan-out lines are arranged on the base substrate 110 and are spaced apart from each other. That is, the even-numbered data fan-out lines are arranged on a same layer as a layer on which the gate lines GL1~GLn (refer to FIG. 2) are arranged, such that the even-numbered data fan-out lines are covered by the gate insulation layer 141, which is arranged on the base substrate 110. The odd-numbered data fan-out lines are arranged on the gate insulation layer 141 and are spaced apart from each other, thereby electrically insulating the odd-numbered data fan-out lines from the even-numbered data fan-out lines. The odd-numbered data fan-out lines are covered by the protective layer 142.

In an exemplary embodiment, the first data fan-out line DFL1 is arranged on the gate insulation layer 141, and the second data fan-out line DFL2, which is adjacent to the first data fan-out line DFL1, is arranged under the gate insulation layer 141, such that the first and second data fan-out lines DFL1 and DFL2 may be electrically insulated from each other.

As described above, two adjacent data fan-out lines, which are arranged on the same layer, are spaced apart from each other, and two adjacent data fan-out lines, which are arranged on different layers, appear to make contact with each other in a top plan view. Thus, in exemplary embodiments, a distance between adjacent data fan-out lines may be reduced in the second and fourth sub areas SA2 and SA4, such that the array substrate 100 may include numerous data fan-out lines arranged in the peripheral area PA.

In FIGS. 4 and 5, the data fan-out lines which are arranged in the second sub area SA2 have been described in detail, however the data fan-out lines which are arranged in the fourth sub area SA4 may include a same structure as that of the data fan-out lines arranged in the second sub area SA2.

Figure 6:
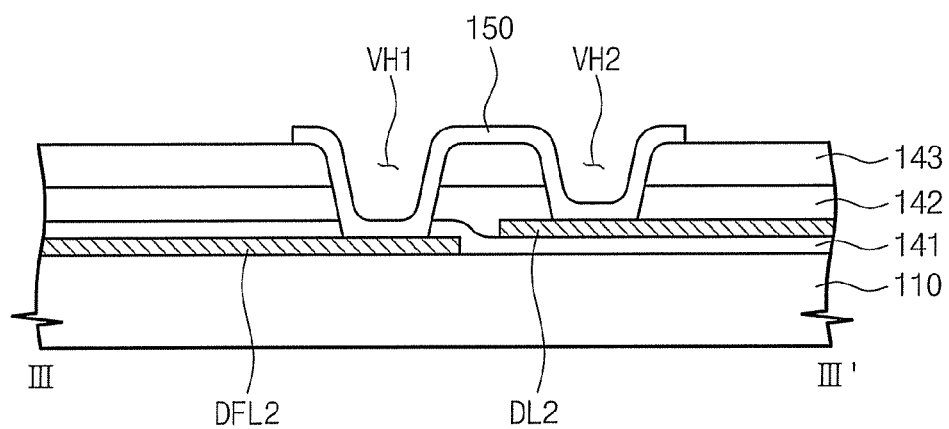
FIG. 6 is a cross-sectional schematic diagram view taken along line III-III' of FIG. 3.

FIG. 6 is a cross-sectional schematic diagram view taken along line III-III' of FIG. 3.

Referring to FIGS. 3 and 6, in exemplary embodiments, the odd-numbered data fan-out lines or the even-numbered data fan-out lines are arranged on the same layer as the layer on which the data lines DL1~DLm are arranged. In FIG. 6, the odd-numbered data fan-out lines are arranged on the same layer as the data lines DL1~DLm, and the even-numbered data fan-out lines are arranged on a different layer from a layer on which the data lines DL1~DLm are arranged. In alternative exemplary embodiments, the odd-numbered data fan-out lines may be arranged on the different layer from the data lines DL1~DLm, and the even-numbered data fan-out lines may be arranged on the same layer as the data lines DL1~DLm.

Each of the odd-numbered data fan-out lines is connected to the corresponding odd-numbered data line among the data lines DL1~DLm in the fifth sub area SA5. Thus, the first data line DL1 which is arranged on the gate insulation layer 141 extends from the first data fan-out line DFL1 of the first data fan-out portion DF1.

Meanwhile, since the even-numbered data fan-out lines are arranged on the different layer from the layer on which the data lines DL1~DLm are arranged, the even-numbered data fan-out lines are thereby insulated from the data lines DL1~DLm. Consequently, the array substrate 100 further includes a first connection electrode 150 in order to electrically connect the even-numbered data fan-out lines with the corresponding even-numbered data lines among the data lines DL1~DLm, respectively.

The first connection electrode 150 is arranged on the organic insulation layer 143. The first connection electrode 150 is formed through a similar process which is used to form the pixel electrodes 130, and the first connection electrode 150 includes a same or substantially similar material as that of the pixel electrodes 130. The first connection electrode 150 is arranged at positions corresponding to the even-numbered data lines, respectively, in the fifth sub area SA5 in order to electrically connect the even-numbered data fan-out lines with the even-numbered data lines, respectively. In other words, the first connection electrode 150 is electrically connected to the second data fan-out line DFL2 of the first data fan-out portion DF1 and to the second data line DL2 corresponding to the second data fan-out line DFL2. Thus, in exemplary embodiments, the second data fan-out line DFL2 of the first data fan-out portion DF1 may be electrically connected to the second data line DL2.

In the current exemplary embodiment, the gate insulation layer 141, the protective layer 142 and the organic insulation layer 143 are provided with a first via or through hole VH1 through which the corresponding even-numbered data fan-out line is partially exposed. Further, the protective layer 142 and the organic insulation layer 143 are provided with a second via or through hole VH2 through which the corresponding even-numbered data line is partially exposed. The first connection electrode 150 is electrically connected to the corresponding even-numbered data fan-out line through the first through hole VH1 and to the corresponding even-data line through the second through hole VH2.

Figure 7:
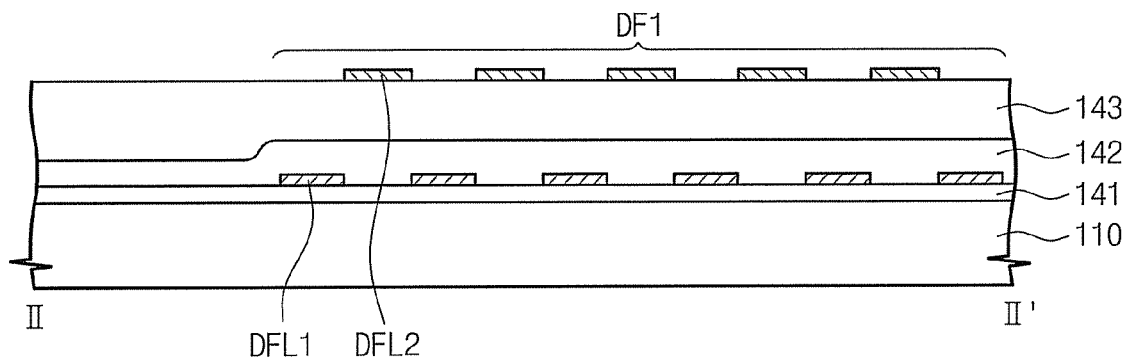
FIG. 7 is a cross-sectional schematic diagram view illustrating another exemplary embodiment of data fan-out lines according to the present invention.

FIG. 7 is a cross-sectional schematic diagram view illustrating another exemplary embodiment of data fan-out lines according to the present invention.

Referring to FIG. 7, the odd-numbered data fan-out lines of the first data fan-out portion DF1 are arranged on the gate insulation layer 141. The even-numbered data fan-out lines of the first data fan-out portion DF1 are arranged on the organic insulation layer 143, which is arranged above the gate insulation layer 141. Thus, the even-numbered data fan-out lines are arranged on the same layer as the layer on which the pixel electrodes 130 are arranged.

In the current exemplary embodiment, the even-numbered data fan-out lines include a same material (e.g. a transparent conductive material) as the pixel electrodes 130, and the even-numbered data fan-out lines are formed through the process used to form the pixel electrodes 130. In exemplary embodiments, the odd-numbered data fan-out lines are arranged on the same layer as the layer on which the data lines DL1~DLm are formed, and the odd-numbered data fan-out lines include a same material (e.g. a non-transparent metal material) as that of the data lines DL1~DLm. In exemplary embodiments, the odd-numbered data fan-out lines may include a different material from that of the even-numbered data fan-out lines.

In alternative exemplary embodiments, the odd-numbered data fan-out lines may be arranged on the same layer as the pixel electrodes 130, and the even-numbered data fan-out lines may be arranged on the same layer as the data lines DL1~DLm.

In an exemplary embodiment in which the even-numbered data fan-out lines include the transparent conductive material, the array substrate 100 does not require the first connection electrode 150 (refer to FIG. 2) in order to connect the even-numbered data fan-out lines with the even-numbered data lines, since the even-numbered data fan-out lines may be directly connected to the even-numbered data lines.

Figure 8:
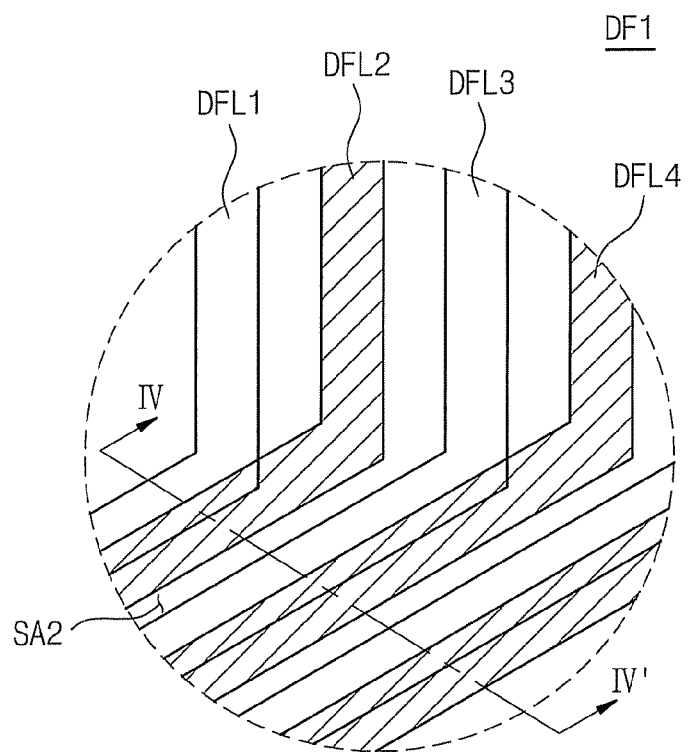
FIG. 8 is a top plan view illustrating another exemplary embodiment of data fan-out lines according to the present invention.
Figure 9:
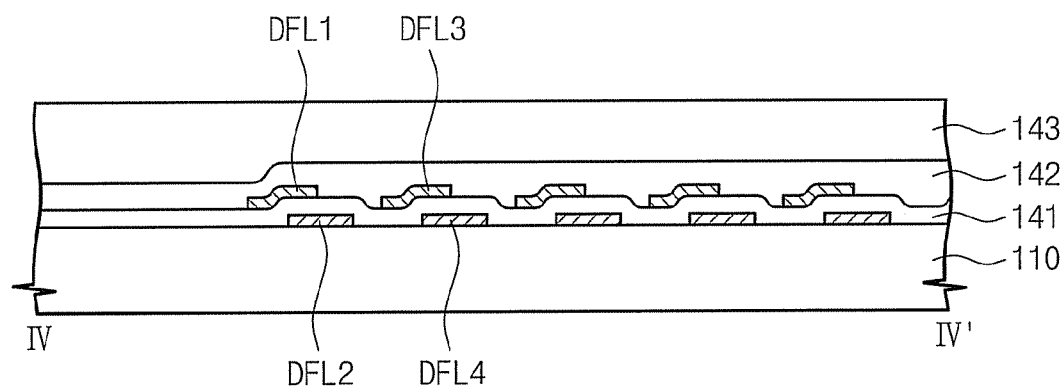
FIG. 9 is a cross-sectional schematic diagram view taken along line IV-IV' of FIG. 8.

FIG. 8 is a top plan view illustrating another exemplary embodiment of data fan-out lines according to the present invention, and FIG. 9 is a cross-sectional schematic diagram view taken along line IV-IV' of FIG. 8.

Referring to FIGS. 8 and 9, odd-numbered data fan-out lines of the first data fan-out portion DF1 are arranged on a different layer as the layer on which even-numbered data fan-out lines are arranged. However, when viewed from a top plan view, the odd-numbered data fan-out lines are overlapped with adjacent even-numbered data fan-out lines, respectively, in the second and fourth sub areas SA2 and SA4. In an exemplary embodiment, the first data fan-out line DFL1 of the first data fan-out portion DF1 is arranged on the gate insulation layer 141 and the first data fan-out line DFL1 is partially overlapped with the second data fan-out line DFL2 in the second sub area SA2. In this case, the second data fan-out line DFL2 includes a same or substantially similar shape as that of the first data fan-out line DFL1, and the second data fan-out line DFL2 extends in a same direction as the first data fan-out line DFL1.

In FIGS. 8 and 9, the odd-numbered data fan-out lines are arranged in a one-to-one correspondence relationship with the even-numbered data fan-out lines. However, in exemplary embodiments, each of the even-numbered data fan-out lines may be overlapped with two adjacent odd-numbered data fan-out lines.

As described above, since each of the odd-numbered data fan-out lines is overlapped with the corresponding even-numbered data fan-out line among the even-numbered data fan-out lies, a capacitance is formed in the overlapped area between the odd-numbered data fan-out line and the even-numbered data fan-out line. When the capacitance in the overlapped area between the odd-numbered data fan-out line and the even-numbered data fan-out line is controlled, a resistance difference between the data fan-out lines may be reduced. In exemplary embodiments, in order to control a difference in a length and a difference in a resistance between the odd and even-numbered data fan-out lines, a size of the overlapped area between the odd-numbered data fan-out line and the even-numbered data fan-out line may be adjusted.

In FIGS. 8 and 9, the data fan-out lines which are arranged in the second sub area SA2 have been described, however the data fan-out lines which are arranged in the fourth sub area SA4 may include a same structure and function as those of the data fan-out lines arranged in the second sub area SA2.

Figure 10:
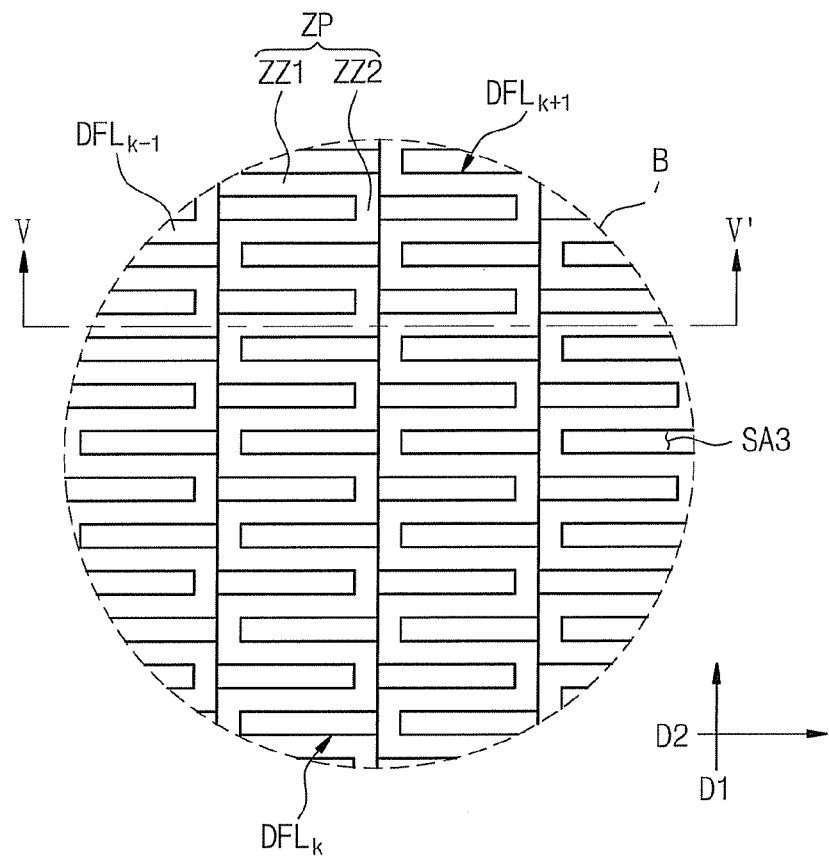
FIG. 10 is an enlarged top plan view illustrating portion 'B' of FIG. 3.
Figure 11:
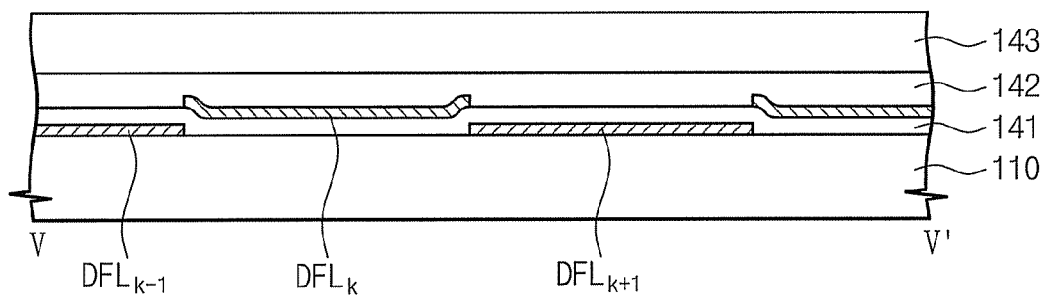
FIG. 11 is a cross-sectional schematic diagram view taken along line V-V' of FIG. 10.

FIG. 10 is an enlarged top plan view illustrating portion 'B' of FIG. 3, and FIG. 11 is a cross-sectional schematic diagram view taken along line V-V' of FIG. 10.

Referring to FIGS. 3 and 10, the data fan-out lines DFL1~DFLi are bent to include a serpentine structure in the third sub area SA3. Hereinafter, portions of the data fan-out lines DFL1~DFLi which are bent to include the serpentine structure will be referred to as a serpentine portion ZP.

In particular, the serpentine portion ZP includes a first serpentine portion ZZ1 extending in the second direction D2 along which the data fan-out lines DFL1~DFLi are arranged and a second serpentine portion ZZ2 extending in the first direction D1, which is a longitudinal direction of the data fan-out lines DFL1~DFLi. In an exemplary embodiment, the serpentine portion ZP is defined by alternately connecting the first and second serpentine portions ZZ1 and ZZ2 along the first direction D1.

In an exemplary embodiment of the present embodiment, the serpentine portion of the odd-numbered data fan-out line appears to make contact with the serpentine portion of the even-numbered data fan-out line in a top plan view. For instance, a second serpentine portion ZZ2 of a k-th data fan-out line DFLk appears to make contact with a second serpentine portion ZZ2 of a (k−1)th data fan-out line DFLk−1 and a second serpentine portion ZZ2 of a (k+1)th data fan-out line DFLk+1. In this case, the k-th data fan-out line DFLk is one of the odd-numbered data fan-out lines, and the (k−1)th data fan-out line DFLk−1 and the (k+1)th data fan-out line DFLk+1 are the even-numbered data fan-out lines which are adjacent to the k-th data fan-out line DFLk.

Referring to FIGS. 10 and 11, the k-th data fan-out line DFLk is arranged on a different layer from a layer on which the (k−1)th and (k+1)th data fan-out lines DFLk−1 and DFLk+1 are arranged. That is, in an exemplary embodiment, the k-th data fan-out line DFLk is arranged on the gate insulation layer 141, and the (k−1)th data fan-out line DFLk−1 and the (k+1)th data fan-out line DFLk+1 are arranged on the base substrate 110.

Thus, although the odd-numbered data fan-out lines and the even-numbered data fan-out lines appear to make contact with each other when viewed from the top plan view, the odd-numbered data fan-out lines may be insulated from the even-numbered data fan-out lines. Consequently, in exemplary embodiments, a distance between adjacent data fan-out lines arranged in the third sub area SA3 may be reduced, and the array substrate 100 may include numerous data fan-out lines in the peripheral area PA, to thereby reduce a difference in a length and a resistance between the data fan-out lines.

Figure 12:
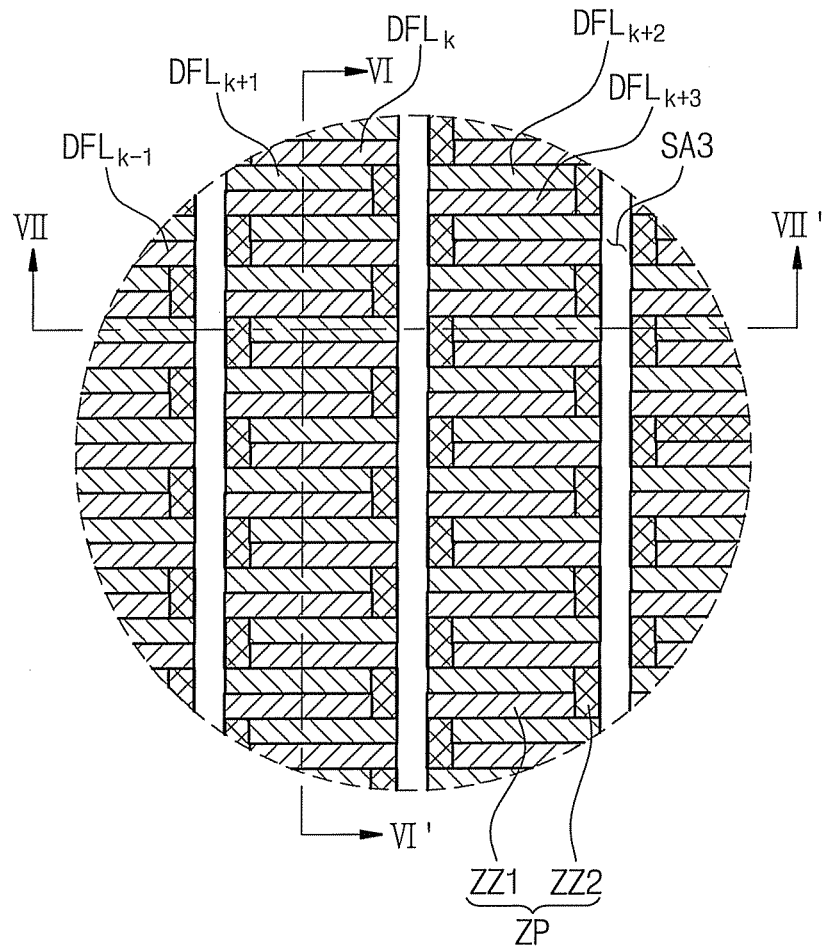
FIG. 12 is a top plan view illustrating another exemplary embodiment of data fan-out lines according to the present invention.
Figure 13:
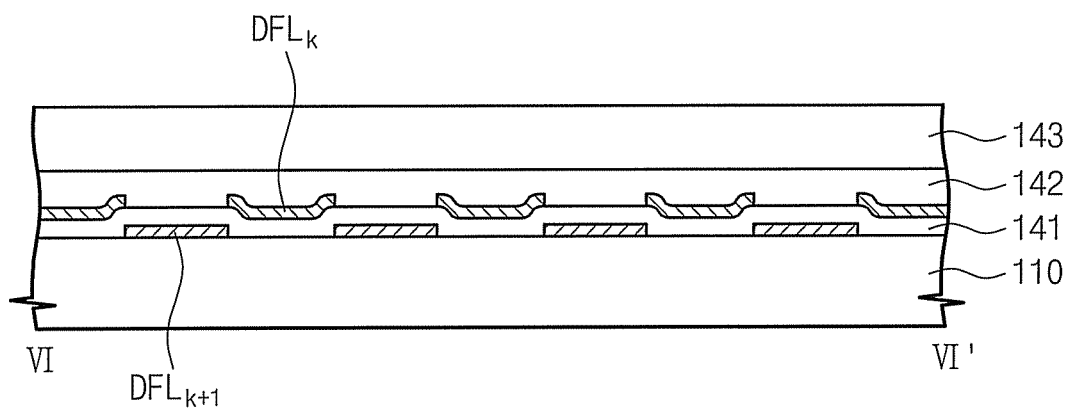
FIG. 13 is a cross-sectional schematic diagram view taken along line VI-VI' of FIG. 12.
Figure 14:
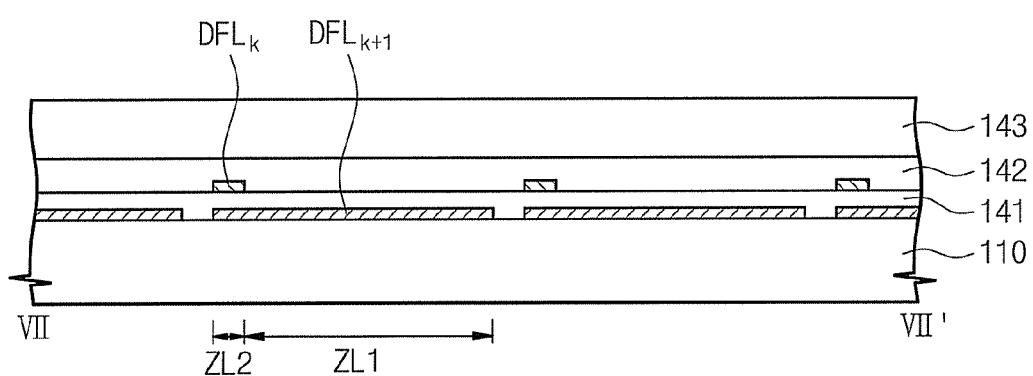
FIG. 14 is a cross-sectional schematic diagram view taken along line VII-VII' of FIG. 12.

FIG. 12 is a top plan view illustrating another exemplary embodiment of data fan-out lines according to the present invention, FIG. 13 is a cross-sectional schematic diagram view taken along line VI-VI' of FIG. 12 and FIG. 14 is a cross-sectional schematic diagram view taken along line VII-VII' of FIG. 12.

Referring to FIGS. 12 to 14, odd-numbered data fan-out lines are arranged on a different layer from a layer on which even-numbered data fan-out lines, which are adjacent to the odd-numbered data fan-out lines, are arranged. Each of the odd-numbered data fan-out lines is overlapped with the adjacent even-numbered data fan-out line. In an exemplary embodiment, the serpentine portion of the k-th data fan-out line DFLk is partially overlapped with the serpentine portion of the (k+1)th data fan-out line DFLk+1. More specifically, the first serpentine portions ZZ1 of the k-th data fan-out line DFLk and the first serpentine portions ZZ1 of the (k+1)th data fan-out line DFLk+1 are alternately arranged. Also, the second serpentine portions ZZ2 of the k-th data fan-out line DFLk are partially overlapped with the serpentine portions of the (k+1)th data fan-out line DFLk+1, respectively. Since the gate insulation layer 141 is arranged between the k-th data fan-out line DFLk and the (k+1)th data fan-out line DFLk+1, a capacitance is formed between the k-th data fan-out line DFLk and the (k+1)th data fan-out line DFLk+1 in an area in which the k-th data fan-out line DFLk and the (k+1)th data fan-out line DFLk+1 overlap.

In exemplary embodiments, a size of the overlapped area between the k-th data fan-out line DFLk and the (k+1)th data fan-out line DFLk+1 may be adjusted according to a difference in a length and a resistance of the data fan-out lines DFL1~DFLi.

In the current exemplary embodiment, the first serpentine portions ZZ1 of the odd-numbered data fan-out lines are not overlapped with the first serpentine portions ZZ1 of the adjacent even-numbered data fan-out lines. However, in exemplary embodiments, the first serpentine portions ZZ1 of the odd-numbered data fan-out lines may be overlapped with the first serpentine portions ZZ1 of the adjacent even-numbered data fan-out lines.

In an exemplary embodiment of the present embodiment, the odd-numbered data fan-out lines, which are adjacent to each other, are overlapped with different even-numbered data fan-out lines. In an exemplary embodiment, assuming that the k-th data fan-out line DFLk and the (k+2)th data fan-out line DFLk+2 are the odd-numbered data fan-out lines and the (k+1)th data fan-out line DFLk+1 and the (k+3)th data fan-out line DFLk+3 are the even-numbered data fan-out lines, the serpentine portion of the k-th data fan-out line DFLk is partially overlapped with the serpentine portion of the (k+1)th data fan-out line DFLk+1, and the serpentine portion of the (k+2)th data fan-out line DFLk+2 is partially overlapped with the serpentine portion of the (k+3)th data fan-out line DFLk+3.

As described above, in exemplary embodiments, the size of the serpentine portion ZP may be readily adjusted since the serpentine portion of the odd-numbered data fan-out and the serpentine portion of the even-numbered data fan-out overlap each other. Thus, in exemplary embodiments, the first data fan-out portion DF1 (refer to FIG. 3) may reduce the difference in length and resistance between the data fan-out lines.

Referring again to FIG. 1, the array substrate 100 further includes a plurality of gate fan-out portions to receive the gate signals and to provide the gate signals to the gate lines GL1~GLn. In an exemplary embodiment, the gate fan-out portions include first, second and third gate fan-out portions GF1, GF2 and GF3, however, a number of the gate fan-out portions may increase or decrease according to a number of the gate lines GL1~GLn and a number of the gate driving chips (not shown), which output the gate signals.

Each of the first to third gate fan-out portions GF1~GF3 includes first to j-th gate fan-out lines GFL1~GFLj (where n is a natural number greater than 1). The first to j-th gate fan-out lines GFL1~GFLj extend substantially in the second direction D2 and are arranged along the first direction D1. Each of the first to j-th gate fan-out lines GFL1~GFLj is electrically connected to a corresponding gate line among the gate lines GL1~GLn in order to provide the gate signals to the corresponding gate line. In an exemplary embodiment, the first gate fan-out line GFL1 of the first gate fan-out portion GF1 is connected to the first gate line GL1, and the second gate fan-out line GFL2 is connected to the second data line GL2.

In the current exemplary embodiment, each of the first to third gate fan-out portions GF1~GF3 includes a same structure and a same function as those of the first data fan-out portion DF1, such that detailed descriptions of the first to third gate fan-out portions GF1~GF3 will be omitted. However, a number of the gate fan-out lines of each of the first to third gate fan-out portions GF1~GF3 may be different from the number of the data fan-out lines of the first data fan-out portion DF1.

Figure 15:
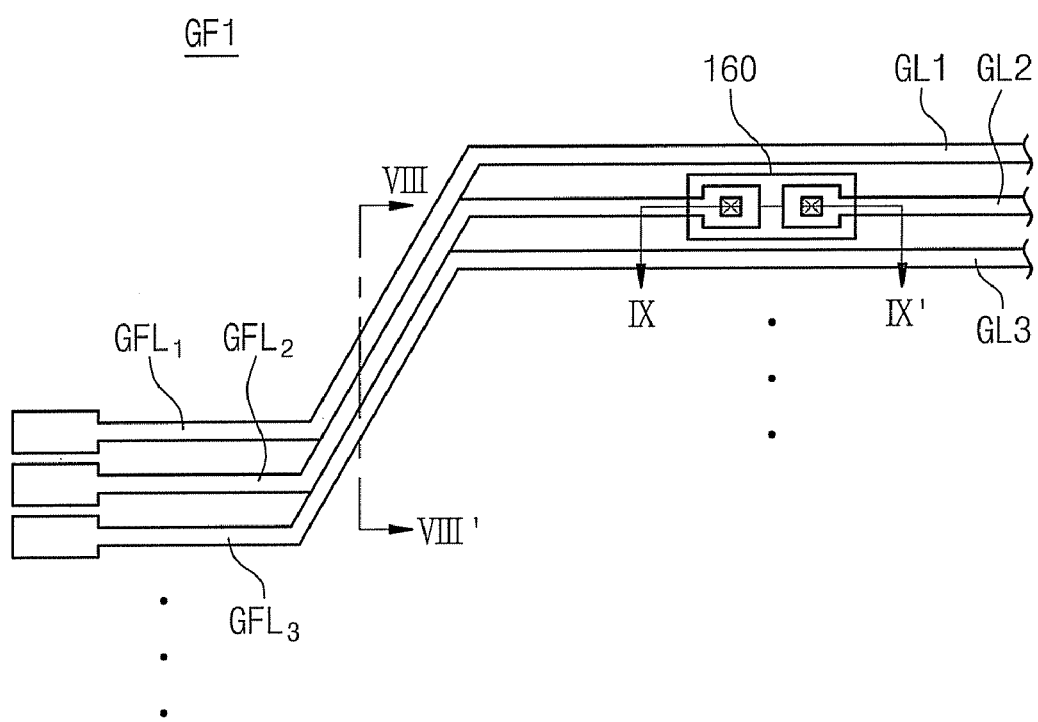
FIG. 15 is a top plan view illustrating an exemplary embodiment of a first gate fan-out portion of FIG. 1.
Figure 16:
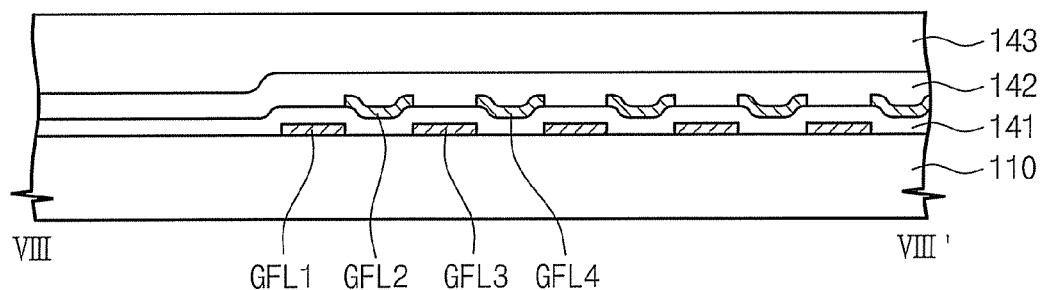
FIG. 16 is a cross-sectional schematic diagram view taken along line VIII-VIII' of FIG. 15.

FIG. 15 is a top plan view illustrating an exemplary embodiment of a first gate fan-out portion of FIG. 1, and FIG. 16 is a cross-sectional schematic diagram view taken along line VIII-VIII' of FIG. 15.

Referring to FIGS. 15 and 16, each of the first to j-th gate fan-out lines GFL1~GFLj appears to make contact with adjacent gate fan-out lines among the first to j-th gate fan-out lines GFL1~GFLj in a top plan view. For instance, the second gate fan-out line GFL2 appears to make contact with the first and third gate fan-out lines GFL1 and GFL3, respectively, in the top plan view. In FIG. 15, a structure in which two odd-numbered gate fan-out lines GFL1 and GFL3, which are adjacent to each other, appear to make contact with one even-numbered gate fan-out line GFL2 has been described, however two odd-numbered gate fan-out lines, which are adjacent to each other, may instead be two even-numbered gate fan-out lines, respectively. Further, in exemplary embodiments, the odd-numbered gate fan-out lines may be overlapped with the even-numbered gate fan-out lines, similar to the first data fan-out portion DF1 shown in FIG. 8.

In exemplary embodiments, the odd-numbered gate fan-out lines are arranged on a different layer from the layer on which the even-numbered gate fan-out lines are arranged, and the gate fan-out lines arranged on the same layer are spaced apart from each other. In the current exemplary embodiment, the odd-numbered gate fan-out lines are arranged on the base substrate 110 as are the gate lines GL1~GLn (refer to FIG. 1) and are covered by the gate insulation layer 141. The even-numbered gate fan-out lines are arranged on the gate insulation layer 141 as the data lines DL1~DLm and spaced apart from each other. In other words, the first gate fan-out line GFL1 is arranged on the base substrate 110, and the second gate fan-out line GFL2 adjacent to the first gate fan-out line GFL1 is arranged on the gate insulation layer 141. Therefore, in exemplary embodiments, the odd-numbered gate fan-out lines may be insulated from the even-numbered gate fan-out lines.

As described above, in exemplary embodiments, two adjacent gate fan-out lines arranged on the same layer are spaced apart from each other, and two adjacent gate fan-out lines arranged on the different layer appears to make contact with each other in a top plan view. Thus, in exemplary embodiments, a distance between adjacent gate fan-out lines may be reduced, such that the array substrate 100 may include numerous gate fan-out lines arranged in the peripheral area PA.

Figure 17:
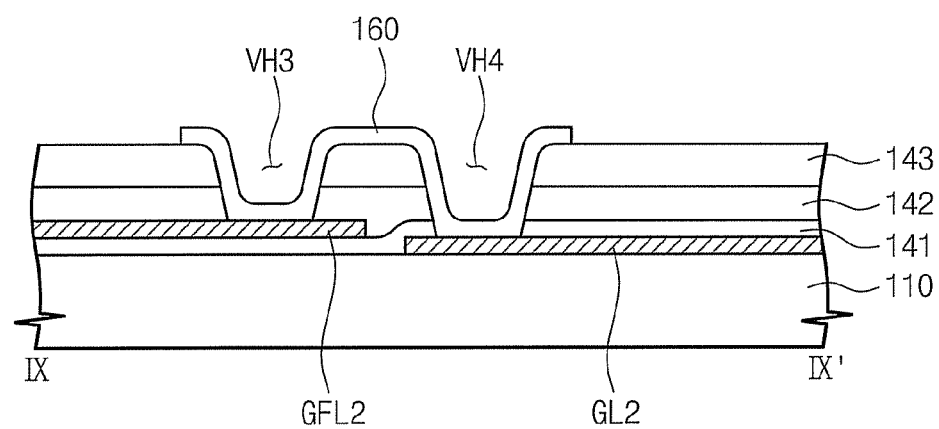
FIG. 17 is a cross-sectional schematic diagram view taken along line IX-IX' of FIG. 15.

FIG. 17 is a cross-sectional schematic diagram view taken along line IX-IX' of FIG. 15.

Referring to FIGS. 15 and 17, since the even-numbered gate fan-out lines arranged on the different layer from the gate lines GL1~GLn (refer to FIG. 1), the even-numbered gate fan-out lines are insulated from the gate lines GL1~GLn. Thus, in exemplary embodiments, the array substrate 100 further includes a second connection electrode 160 in order to electrically connect the even-numbered gate fan-out lines with the even-numbered gate lines.

The second connection electrode 160 is arranged on the organic insulation layer 143. The second connection electrode 160 is formed through a process used to form the pixel electrodes 130 and includes a same or substantially similar material as that of the pixel electrodes 130. The second connection electrode 160 is arranged at positions corresponding to the even-numbered gate lines, respectively, to electrically connect the even-numbered gate fan-out lines with the even-numbered gate lines, respectively. In other words, the second connection electrode 160 is electrically connected to the second gate fan-out line GFL2 of the first gate fan-out portion GF1 and to the second gate line GL2 corresponding to the second gate fan-out line GFL2. Accordingly, in exemplary embodiments, the second gate fan-out line GFL2 of the first gate fan-out portion GF1 may be electrically connected to the second gate line GL2.

In the current exemplary embodiment, the protective layer 142 and the organic insulation layer 143 are provided with a third via or through hole VH3 through which the corresponding even-numbered gate fan-out line among the even-numbered gate fan-out lines is partially exposed. Further, the gate insulation layer 141, the protective layer 142 and the organic insulation layer 143 are provided with a fourth via or through hole VH4 through which the corresponding even-numbered data line among the even-numbered data lines is partially exposed. The second connection electrode 160 is electrically connected to the corresponding even-numbered gate fan-out line through the third via or through hole VH3 and to the corresponding even-numbered gate line through the fourth via or through hole VH4.

In addition, among the gate fan-out lines GFL1~GFLj, the gate fan-out lines are arranged on the different layer from the layer on which the gate lines GL1~GLn are arranged, and the gate fan-out lines are arranged on the same layer as the layer on which the data lines DL1~DLm are arranged. However, in exemplary embodiments, the gate fan-out lines may be arranged on the same layer as the layer on which the pixel electrodes 130 are arranged. In this case, the gate fan-out lines arranged on the different layer from the gate lines GL1~GLn may include the same material (e.g. the transparent conductive material) as that of the pixel electrodes 130. Further, in an exemplary embodiment, the gate fan-out lines arranged on the different layer from the gate lines GL1~GLn are formed through a process used to form the pixel electrodes 130 and are directly connected to the corresponding gate fan-out line without adopting the second connection electrode 160.

Figure 18:
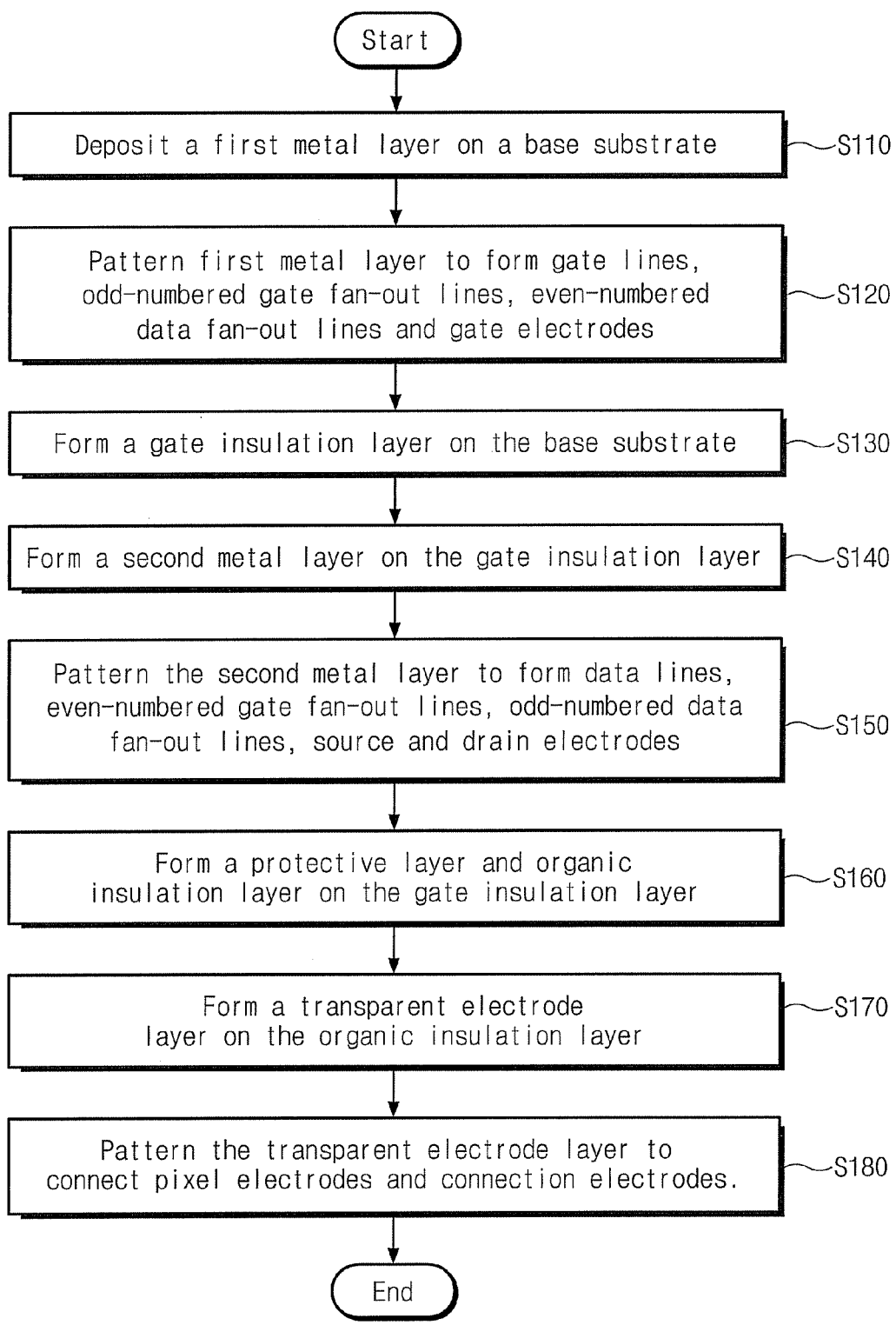
FIG. 18 is a flow chart illustrating an exemplary embodiment of a method of fabricating the exemplary embodiment of the array substrate of FIG. 1.

FIG. 18 is a flow chart illustrating an exemplary embodiment of a method of fabricating the array substrate of FIG. 1.

Referring to FIGS. 1, 2 and 18, a first metal layer is deposited on the base substrate 110 (S110).

In exemplary embodiments, when the first metal layer is patterned, the gate lines GL1~GLn and the gate electrode 121 of the TFTs 120 are formed in the display area DA, and the odd-numbered gate fan-out lines and the even-numbered data fan-out lines are formed in the peripheral area PA (S120). Thus, in exemplary embodiments, the odd-numbered gate fan-out lines are formed on the same layer as the layer on which the gate lines GL1~GLn are formed, and the even-numbered data fan-out lines are formed on the different layer from the layer on which the data lines DL1~DLm are formed.

Then, the gate insulation layer 141 is formed on the base substrate 110 in order to cover the gate lines GL1~GLn, the gate electrode 121, the odd-numbered gate fan-out lines and the even-numbered data fan-out lines (S130)

Next, a second metal layer is formed on the gate insulation layer 141 (S140).

When the second metal layer is patterned, the data lines DL1~DLm and the source and drain electrodes 124 and 125 of the TFTs 120 are formed in the display area DA, and the even-numbered gate fan-out lines and the odd-numbered data lines are formed in the peripheral area PA (S150). Accordingly, the even-numbered gate fan-out lines are formed on the different layer from the layer on which the gate lines GL1~GLn are formed, and the odd-numbered data fan-out lines are formed on the same layer as the layer on which the data lines DL1~DLm are formed.

The protective layer 142 is formed on the gate insulation layer 141 to cover the data lines DL1~DLm, the source and drain electrodes 124 and 125, the even-numbered gate fan-out lines and the odd-numbered data fan-out lines. The organic insulation layer 143 is formed on the protective layer 142 (S160).

A transparent electrode layer is formed on the organic insulation layer 143 (S170). When the transparent electrode layer is patterned, the pixel electrodes 130, the first connection electrode 150 (refer to FIG. 6) and the second connection electrode 160 (refer to FIG. 17) are formed (S180).

Figure 19:
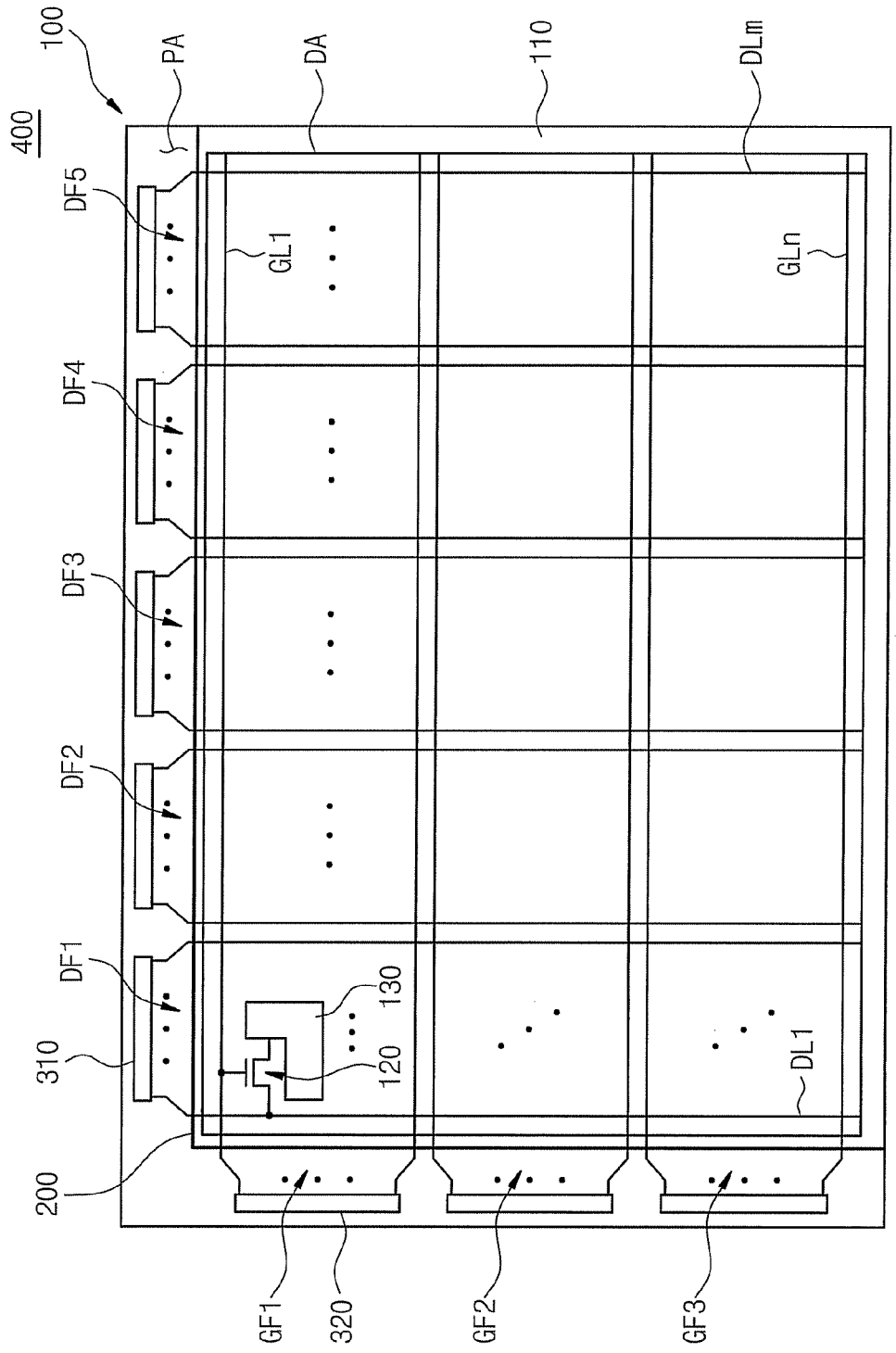
FIG. 19 is a top plan view illustrating an exemplary embodiment of a display apparatus according to the present invention.

FIG. 19 is a top plan view illustrating an exemplary embodiment of a display apparatus according to the present invention.

Referring to FIG. 19, a display apparatus 400 includes an array substrate 100, an opposite substrate 200 facing the array substrate 100, data driving chips 310 mounted on the array substrate 100 and gate driving chips 320 mounted on the array substrate 100.

In the current exemplary embodiment, the array substrate 100 includes a same structure and function as that of the array substrate 100 of FIG. 1, such that detailed descriptions thereof will be omitted in order to avoid redundancy.

The data driving chips 310 correspond to the data fan-out portions DF1~DF5 in a one-to-one correspondence relationship, and the data driving chips 310 output the data signals to the corresponding data fan-out portion. Also, the gate driving chips 320 correspond to the gate fan-out portions GF1~GF3, and the gate driving chips 320 output the gate signals to the corresponding gate fan-out portion.

According to the above, in exemplary embodiments, since the odd-numbered fan-out lines are arranged on the different layer from the even-numbered fan-out lines, the distance between the odd-numbered fan-out line and the even-numbered fan-out line may be reduced in top plan view. Thus, in exemplary embodiments, the array substrate 100 may include numerous data and gate fan-out lines, thereby reducing a difference in length and resistance between the data fan-out lines. As a result, in exemplary embodiments, the display apparatus may prevent or substantially reduce a delay of signal transmission and include an improved display quality.

Although some exemplary embodiments of the present invention have been described, it is understood that the present invention should not be limited to these exemplary embodiments but various changes and modifications can be made by one of ordinary skill in the art within the spirit and scope of the present invention as hereinafter claimed.

What is claimed is:

1. An array substrate comprising:
   a base substrate on which a display area for displaying-to display an image thereon and a peripheral area adjacent to the display area are defined;
   a plurality of fan-out lines arranged in the peripheral area to receive a driving signal from an external source, all of the fan-out lines being alternately arranged on two different layers so that two adjacent fan-out lines among the fan-out lines are arranged on different layers;
   a plurality of signal lines arranged in the display area to receive the driving signal from the fan-out lines; and
   a pixel array arranged in the display area to receive the driving signal from the signal lines.

2. An array substrate comprising:
   a base substrate on which a display area to display an image thereon and a peripheral area adjacent to the display area are defined;
   a plurality of fan-out lines arranged in the peripheral area to receive a driving signal from an external source, all of the fan-out lines being alternately arrange on two different layers so that odd-numbered fan-out lines among the fan-out lines are arranged on a different layer from a layer on which even-numbered fan-out lines among the fan-out lines are arranged;
   a plurality of signal lines arranged in the display area to receive the driving signal from the fan-out lines; and
   a pixel array arranged in the display area to receive the driving signal from the signal lines.

3. The array substrate of claim 2, wherein the odd-numbered fan-out lines appear to make contact with the even-numbered fan-out lines in a plan view.

4. The array substrate of claim 2, wherein two adjacent fan-out lines arranged on a same layer are spaced apart from each other at a predetermined distance, and each of the odd-numbered fan-out lines is overlapped with an adjacent even-numbered fan-out line among the even-numbered fan-out lines.

5. The array substrate of claim 2, wherein either the odd-numbered fan-out lines or the even-numbered fan-out lines are arranged on a same layer as a layer on which the signal lines are arranged.

6. The array substrate of claim 5, wherein the signal lines are arranged in a one-to-one correspondence with the fan-out lines.

7. The array substrate of claim 6, further comprising at least one insulation layer covering the odd-numbered fan-out lines and the even-numbered fan-out lines, and the at least one insulation layer insulating the odd-numbered fan-out lines from the even-numbered fan-out lines.

8. The array substrate of claim 7, wherein the pixel array comprises:
   a plurality of thin film transistors arranged in the display area in a matrix configuration, the thin film transistors connected to the signal lines to receive the driving signal; and
   a plurality of pixel electrodes arranged in the display area in a matrix configuration, the pixel electrodes being arranged on the at least one insulation layer and electrically connected to the thin film transistors.

9. The array substrate of claim 8, further comprising at least one connection electrode arranged on the insulation layer to electrically connect the fan-out lines, which are arranged on a different layer from the layer on which the signal lines are arranged, with corresponding signal lines among the signal lines.

10. The array substrate of claim 9, wherein the insulation layer is partially removed to provide a through hole through which the fan-out lines arranged on the different layer from the plurality-of signal lines are exposed, the at least one connection electrode is electrically connected to the fan-out lines arranged on the different layer from the signal lines through the through hole.

11. The array substrate of claim 9, wherein the at least one connection electrode is arranged on a same layer as a layer on which the pixel electrodes are arranged.

12. The array substrate of claim 8, wherein the fan-out lines arranged on the different layer from the signal lines are arranged on a same layer as a layer on which the pixel electrodes are arranged.

13. The array substrate of claim 12, wherein the fan-out lines arranged on the same layer as the layer on which the pixel electrodes are arranged comprise a same material as that of the pixel electrodes.

14. The array substrate of claim 5, wherein the odd-numbered fan-out line and the even-numbered fan-out line adjacent to the odd-numbered fan-out line appear to make contact with each other in a plan view.

15. The array substrate of claim 5, wherein two adjacent fan-out lines arranged on a same layer are spaced apart from each other at a predetermined distance, and each of the odd-numbered fan-out lines is overlapped with an adjacent even-numbered fan-out line among the even-numbered fan-out lines.

16. The array substrate of claim 2, wherein the odd-numbered fan-out lines comprise a different material from that of the even-numbered fan-out lines.

17. The array substrate of claim 2, wherein each of fan-out line of the fan-out lines is partially bent to include a serpentine portion.

18. The array substrate of claim 17, wherein the serpentine portion of each of the fan-out lines comprises:
   a first serpentine portion extending in a direction along which the fan-out lines are arranged; and
   a second serpentine portion extending from the first serpentine portion to a longitudinal direction of the fan-out lines.

19. The array substrate of claim 18, wherein two adjacent fan-out lines arranged on a same layer are spaced apart from each other at a predetermined distance, and the second serpentine portion of each of the odd-numbered fan-out lines is overlapped with the second serpentine portion of an adjacent even-numbered fan-out line among the even-numbered fan-out lines.

20. The array substrate of claim 19, wherein the second serpentine portion of two adjacent odd-numbered fan-out lines is overlapped with different second serpentine portions of the even-numbered fan out lines.

21. The array substrate of claim 19, wherein the first serpentine portion of the odd-numbered fan-out lines and the first serpentine portion of the even-numbered fan-out lines adjacent to the odd-numbered fan-out lines are alternately arranged in a plan view.

22. The array substrate of claim 17, wherein the serpentine portion of the odd-numbered fan-out lines and the serpentine portion of the even-numbered fan-out lines adjacent to the odd-numbered fan-out lines are alternately positioned along a direction in which the plurality of fan-out lines are arranged, and the serpentine portion of the odd-numbered fan-out lines and the serpentine portion of the even-numbered fan-out lines adjacent to the odd-numbered fan-out lines appear to make contact with each other in a plan view.

23. The array substrate of claim 17, wherein either the odd-numbered fan-out lines or the even-numbered fan-out lines are arranged on a same layer as a layer on which the signal lines are arranged.

* * * * *